United States Patent [19]

Kobayashi et al.

[11] Patent Number: 4,529,890

[45] Date of Patent: Jul. 16, 1985

[54] LIQUID CRYSTAL DRIVER CIRCUIT

[75] Inventors: Atsushi Kobayashi; Yoshiaki Moriya, both of Tokyo; Ryo Mitani, Yokohama, all of Japan

[73] Assignee: Tokyo Shibaura Denki Kabushiki Kaisha, Kawasaki, Japan

[21] Appl. No.: 421,069

[22] Filed: Sep. 22, 1982

[30] Foreign Application Priority Data

Oct. 15, 1981 [JP] Japan ................................ 56-164702

[51] Int. Cl.[3] ...................... H03K 3/01; H03K 17/687; G09F 9/00

[52] U.S. Cl. ................................ 307/270; 307/296 R; 307/571; 340/778; 340/805; 340/811

[58] Field of Search ........... 307/270, 582, 571, 296 R; 340/761, 765, 784, 811; 350/332

[56] References Cited

U.S. PATENT DOCUMENTS 3,388,293 6/1968 Petschauer .......................... 307/296
4,027,305 5/1977 Kishimoto .......................... 307/270
4,158,786 6/1979 Hirasawa .......................... 350/332
4,242,679 12/1980 Morozumi et al. ................. 350/332
4,383,737 5/1983 Hibino et al. ....................... 350/332
4,492,957 1/1985 Marentic ............................ 340/805

*Primary Examiner*—Stanley D. Miller
*Assistant Examiner*—B. P. Davis

[57] ABSTRACT

A liquid crystal driver circuit has first to fourth resistors serially connected between a positive power source terminal and a reference power source terminal, first and second MOS transistors respectively connected in parallel with the first and fourth resistors, a common electrode driver circuit for generating common electrode bias signals in accordance with common electrode selection signals, and a segment electrode driver circuit for generating segment electrode bias signals in accordance with segment data. A third switching MOS transistor is coupled between the reference power source terminal and the series circuit of the first to fourth resistors.

8 Claims, 21 Drawing Figures

LIQUID CRYSTAL DRIVER CIRCUIT

BACKGROUND OF THE INVENTION

The present invention relates to a liquid crystal driver circuit.

A liquid crystal driver circuit as shown in FIG. 1 is known. This liquid crystal driver circuit has a voltage divider circuit 10, a common electrode drive circuit 20 and a segment electrode drive circuit 30. The voltage divider circuit 10 has resistors R1 to R4 series-connected between power source terminals VD and VL, p-channel MOS transistors TR1 and TR2 and n-channel MOS transistors TR3 and TR4 connected in parallel with the resistors R1 to R4, and p- and n-channel MOS transistors TR5 and TR6 respectively connected in parallel with the resistors R1 to R4. Resistors R5 to R8 are respectively connected in series with the MOS transistors TR1 to TR4, and an input terminal VI for receiving a clock pulse CP is connected to the gates of the MOS transistors TR1 and TR2. The input terminal VI is connected to the gates of the MOS transistors TR3 and TR4 through an inverter 12. A control terminal CLT for receiving a voltage polarity selection signal VPS, for selecting the polarity of the voltage to be applied to the liquid crystal, is connected to the gates of the MOS transistors TR5 and TR6.

The resistors R1 to R4 have a resistance of, for example, 100 kΩ, and the resistors R5 to R8 have a resistance of, for example, 10 kΩ.

The common electrode drive circuit 20 has p-channel MOS transistors TR7 and TR8 and n-channel MOS transistors TR9 and TR10 whose current paths are series-connected between the power source terminals VD and VL; p- and n-channel MOS transistors TR11 and TR12 which are connected in parallel with each other between a node N1 between the resistors R2 and R3 and a node between the MOS transistors TR8 and TR9; and a NAND gate 21 which receives a first common electrode selection signal CES1 and a blanking signal $\overline{\text{BLK}}$. The gates of the MOS transistors TR7 and TR10 are connected to the control terminal CLT through an inverter 22, the gates of the MOS transistors TR8 and TR12 are connected to the output terminal of the NAND gate 21, and the gates of the MOS transistors TR9 and TR11 are connected to the output terminal of the NAND gate 21 through an inverter 24. The node between the MOS transistors TR8 and TR9 is connected to a first common electrode bias terminal CET1. Circuit sections 25 and 26 are of the same configuration as that of a circuit section 27 indicated by the broken line in FIG. 1. The circuit sections 25 and 26 supply bias signals to second and third common electrode bias terminals CET2 and CET3 in response to output signals from NAND gates 28 and 29. One input terminal of each of the NAND gates 28 and 29 receives the blanking signal $\overline{\text{BLK}}$, while the other input terminal thereof receives second and third common electrode selection signals CES2 and CES3.

The segment electrode drive circuit 30 has a first segment bias circuit 31-1 formed of p- and n-channel MOS transistors TR13 and TR14 which are series-connected between a node N2 between the resistors R1 and R2 and a node N3 between the resistors R3 and R4; second to N-th segment bias circuits 31-2 to 31-N of the same configuration as that of the first segment bias circuit 31-1; an N-stage register 32 for storing the segment data from an external circuit (not shown); and latch circuits 33-1 to 33-N which are coupled to the N output stages of the register 32. The segment bias circuits 31-1 to 31-N are respectively connected to segment electrode bias terminals SET1 to SETN.

The mode of operation of the liquid crystal driver circuit shown in FIG. 1 will now be described with reference to FIGS. 2A to 2G. FIGS. 2A to 2E respectively show the clock pulse supplied to the input terminal VI, the common electrode selection signals CES1 to CES3 supplied to the NAND gates 21, 28, and 29, and the signal supplied to the control terminal CLT.

The potentials at the nodes N1, N2 and N3 of the voltage divider circuit 10 are each set at one of two levels in accordance with the voltage polarity selection signal VPS applied to the control terminal CLT, as shown in Table 1 below:

TABLE 1

| VPS | HIGH | LOW |
|---|---|---|
| N1 | $\frac{1}{3}$(VD − VL) | $\frac{2}{3}$(VD − VL) |
| N2 | $\frac{2}{3}$(VD − VL) | VD |
| N3 | VL | $\frac{1}{3}$(VD − VL) |

The MOS transistors TR1 to TR4 are incorporated to speed up the setting of the potential levels at the nodes N1 to N3. When the clock pulse CP is supplied to the input terminal VI, these MOS transistors TR1 to TR4 are all turned on. Therefore, the potential levels at the nodes N1 to N3 are determined quickly in accordance with the resistances of the resistors R5 to R8 and the conduction states of the MOS transistors TR5 and TR6.

In response to the voltage polarity selection signal VPS, the first to third common electrode selection signals CES1 to CES3, and the blanking signal $\overline{\text{BLK}}$, the common electrode drive circuit 20 supplies an output signal having a selected level to the first to third common electrode bias terminals CET1 to CET3. For example, if the blanking signal $\overline{\text{BLK}}$ is at a logic level "0", the MOS transistors TR11 and TR12 and the corresponding MOS transistors in the circuit sections 25 and 26 are turned on, so that the first to third common electrode bias terminals CET1 to CET3 are set at the same potential level as that of the node N1 of the voltage divider circuit 10. As shown in FIG. 2F, these common electrode bias terminals are set at the potential level of $\frac{1}{3}$(VD−VL) or $\frac{2}{3}$(VD−VL) in synchronism with the voltage polarity selection signal VPS. Therefore, the liquid crystal may not be biased in this case.

On the other hand, if the blanking signal $\overline{\text{BLK}}$ is at a logic level "1", when the first common electrode selection signal CES1 is at a logic level "0", an output voltage of the potential level of $\frac{1}{3}$(VD−VL) or $\frac{2}{3}$(VD−VL) is supplied to the common electrode bias terminal CET1 in accordance with the potential level of the voltage polarity selection signal VPS, as shown in FIG. 2G. If the first common electrode selection signal CES1 is at a logic level "1", the MOS transistors TR8 and TR9 are turned on, and an output voltage of the same potential level as that of the voltage polarity selection signal VPS is supplied to the first common electrode bias terminal CET1. In a similar manner, voltages of VD and VL levels are applied to the second and third common electrode bias terminals CET2 and CET3 at timings different from those indicated by the waveform in FIG. 2F. In this case, in accordance with the segment data stored in the register 32, the liquid crystal is biased by a combination of the voltage supplied to the segment electrode bias terminals SET1 to SETN and the voltage supplied to the common electrode bias terminals CET1 to CET3.

When the liquid crystal driver circuit as described above is used for a CMOS one-chip microcomputer of low power consumption as shown in FIG. 3, a current flows through the resistors R1 to R4, for example, to consume power even while data is not displayed by the blanking signal $\overline{BLK}$. If the MOS transistors TR1 to TR4 are on, a greater current such as 100 nA flows through the resistors TR1 to TR4. For this reason, the power consumption of the overall microcomputer is increased, and the low power consumption feature of the CMOS transistor circuit is impaired.

SUMMARY OF THE INVENTION

It is therefore an object of the present invention to provide a liquid crystal driver circuit which consumes less power.

According to an aspect of the present invention, there is provided a liquid crystal driver circuit comprising a voltage divider circuit which generates a liquid crystal driving voltage and which includes a plurality of resistive means series-connected between first and second power source terminals and at least one first switching means connected in parallel with at least one of said plurality of resistive means; and second switching means connected in series with said plurality of resistive means between said first and second power source terminals.

DETAILED DESCRIPTION OF THE PREFERRED EMBODIMENTS

Figure 1:
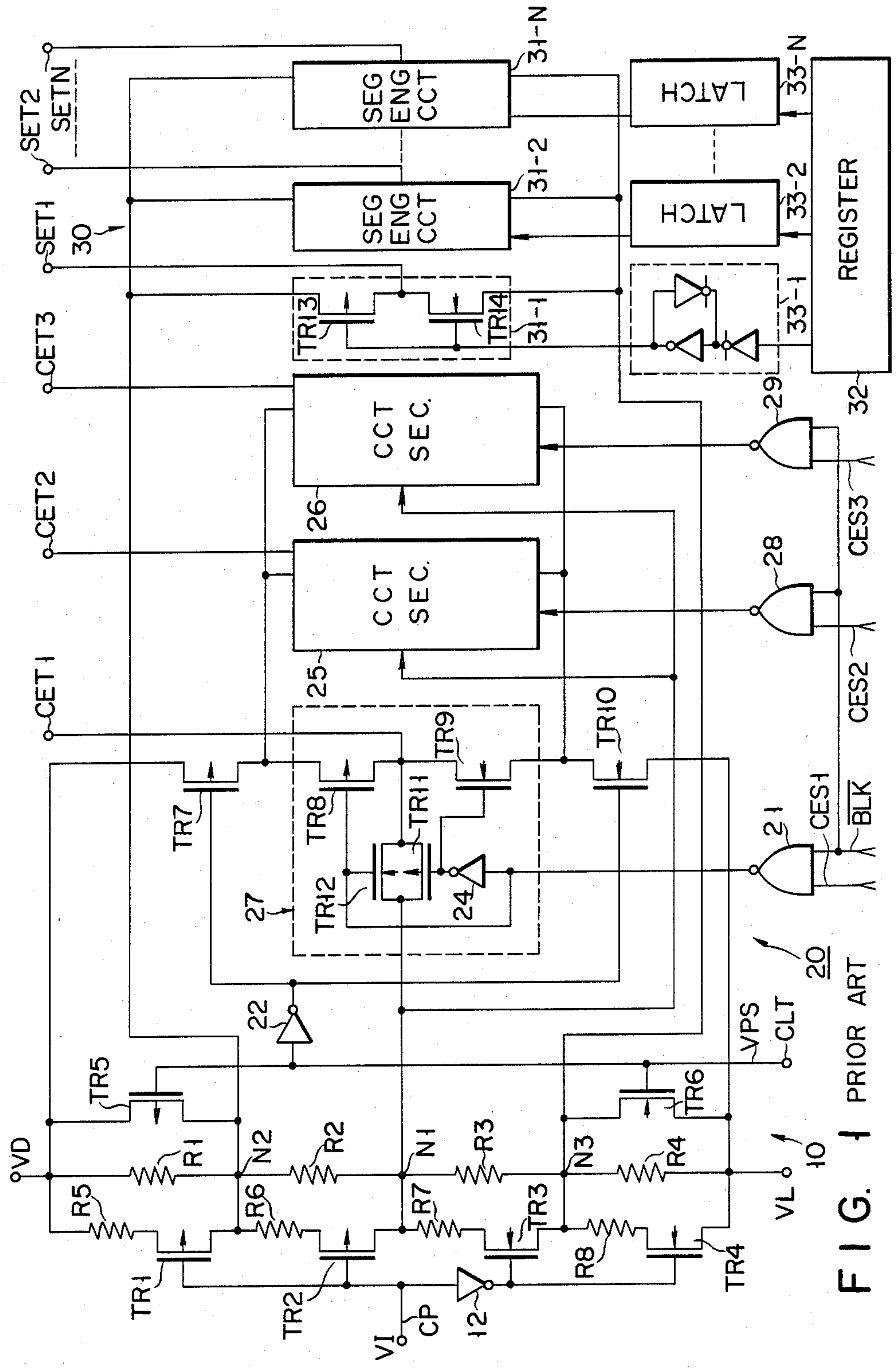
FIG. 1 PRIOR ART
FIG. 1 is a circuit diagram of a conventional liquid crystal driver circuit.
Figure 2A:
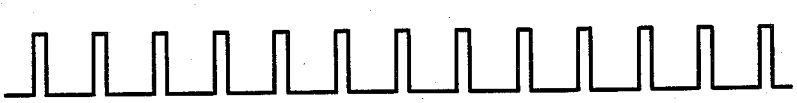
FIGS. 2A to 2G show signal waveforms for explaining the mode of operation of the circuit shown in FIG. 1.
Figure 2B:
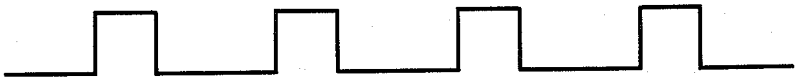
Figure 2C:
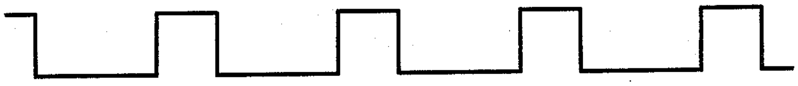
Figure 2D:
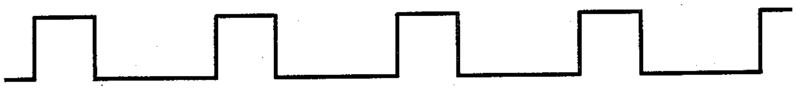
Figure 2E:
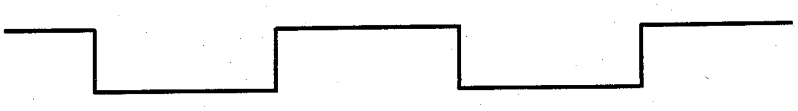
Figure 2F:
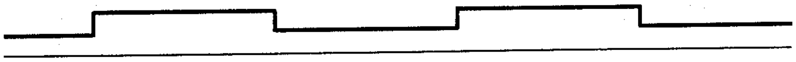
Figure 2G:
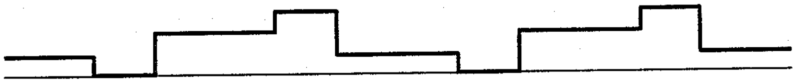
Figure 3:
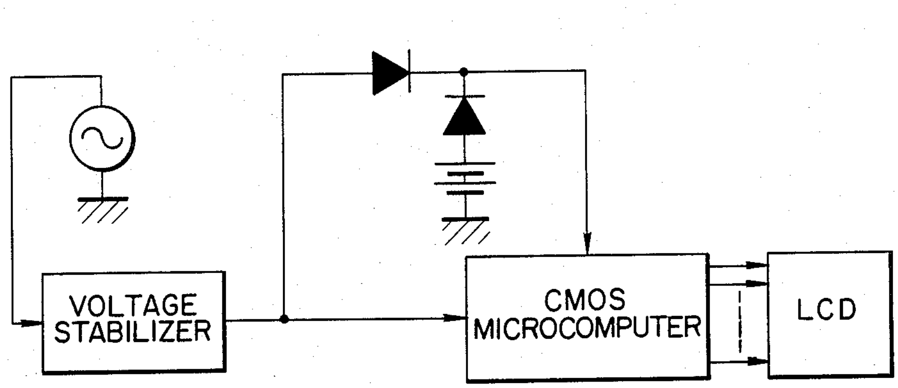
FIG. 3 is a block diagram of a microcomputer system incorporating the liquid crystal driver circuit, a power source for the microcomputer system, and a liquid crystal display.
Figure 4:
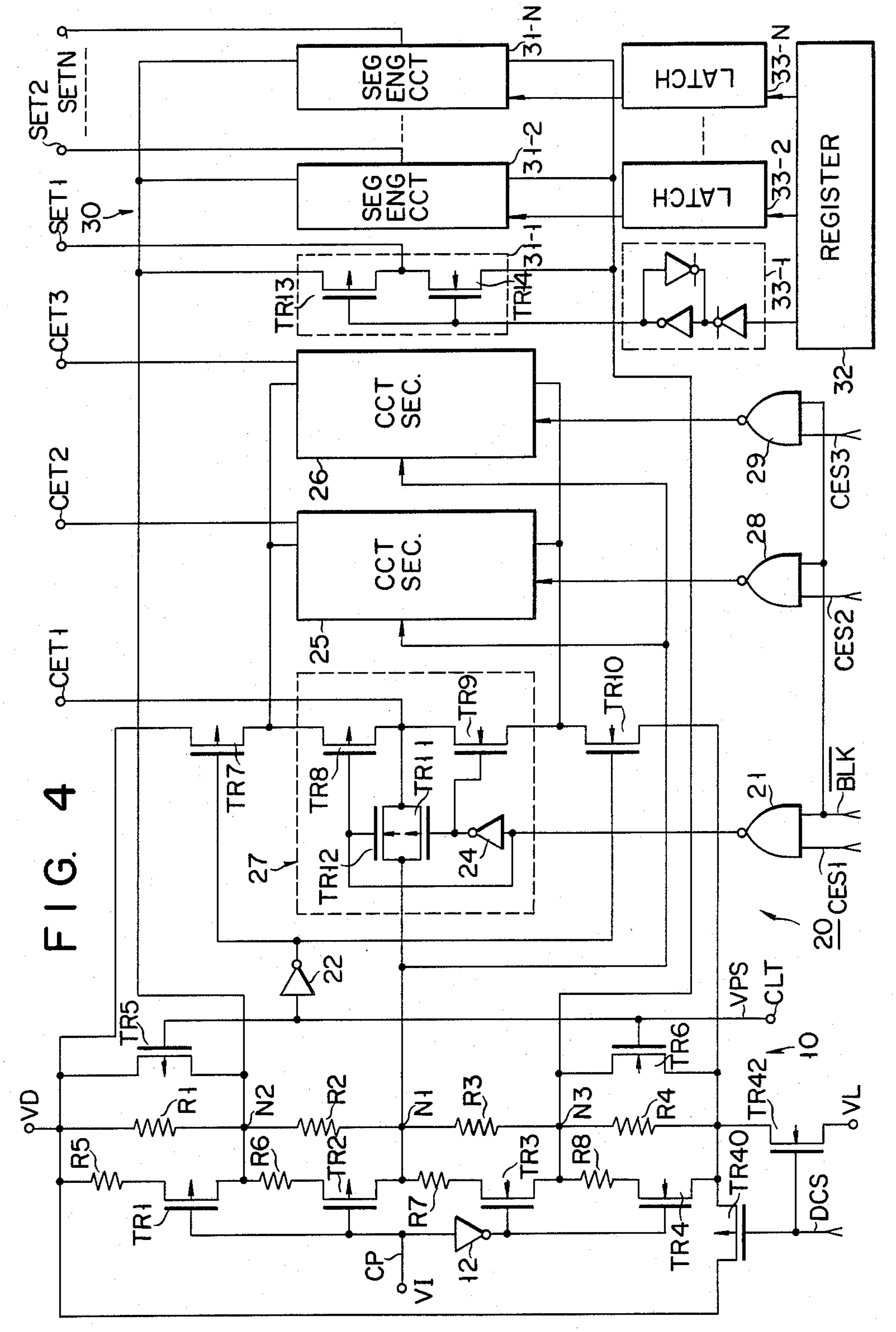
FIG. 4 is a circuit diagram of a liquid crystal driver circuit according to an embodiment of the present invention.

FIG. 4 shows a liquid crystal driver circuit according to an embodiment of the present invention. The liquid crystal driver circuit of this embodiment is basically the same as that shown in FIG. 1 except that it further has a p-channel MOS transistor TR40 connected between a power source terminal VD and a resistor R4, and an n-channel MOS transistor TR42 connected between the resistor R4 and a power source terminal VL.

Figure 5A:
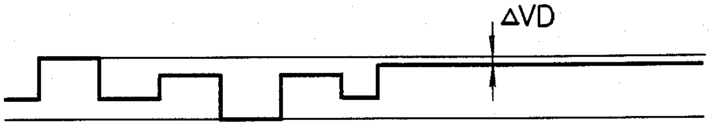
FIGS. 5A to 5J show signal waveforms for explaining the mode of operation of the liquid crystal driver circuit shown in FIG. 4.
Figure 5B:
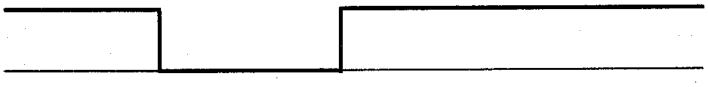
Figure 5C:
Figure 5D:
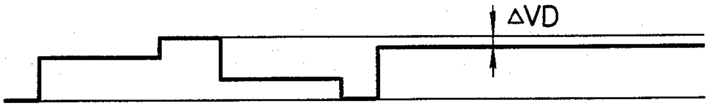
Figure 5E:
Figure 5F:
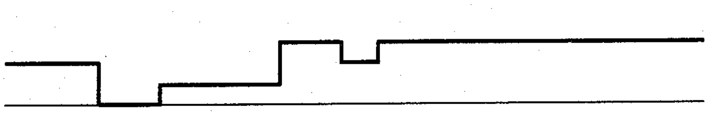
Figure 5G:
Figure 5H:
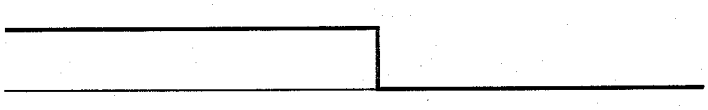
Figure 5I:
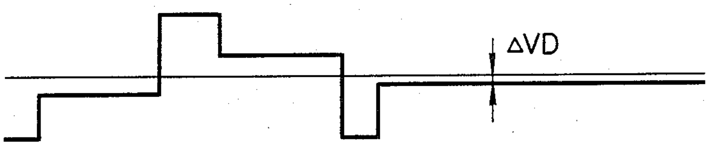
Figure 5J:

A case will be considered wherein voltage signals of the waveforms shown in FIGS. 5A to 5C are respectively applied to first to third segment electrode bias terminals, and voltage signals of the waveforms shown in FIGS. 5D to 5F are applied to first to third common electrode bias terminals CET1 to CET3. FIG. 5G shows the waveform of a voltage polarity selection signal VPS, and FIG. 5H shows the waveform of a display control signal DCS applied to the gates of the MOS transistors TR40 and TR42. When the display control signal DCS is at a logic level "1", a bias voltage of the waveform as shown in FIG. 5I is applied across the liquid crystal between the segment electrode to which the segment voltage as shown in FIG. 5B is applied and the common electrode to which the common voltage of the waveform as shown in FIG. 5D is applied. The liquid crystal between these segment and common electrodes is thus activated. A voltage of the potential levels of $\frac{1}{3}$(VD−VL) and $\frac{2}{3}$(VD−VL) as shown in FIG. 5J is applied to the liquid crystal across the segment electrode to which the segment voltage as shown in FIG. 5C is applied and the common electrode to which the common voltage as shown in FIG. 5E is applied. The liquid crystal between these segment and common electrodes is not activated.

Assume that the common voltage as shown in FIG. 5D is at a VL level or a first common electrode selection signal CES1 is at a logic level "1". Then, when the display control signal DCS goes to a logic level "0", the MOS transistor TR40 is turned on, and the MOS transistor TR42 is turned off. Then, a voltage of VD level is applied across two ends of the series circuit of the resistors R1 to R4. Therefore, a current may not flow through the resistors R1 to R4, and the power consumption of the drive circuit may be reduced to the minimum. The nodes N1 to N3 are all set at the VD level, and a voltage of about VD level is applied to the common electrode bias terminals CET1 to CET3 and to the segment electrode bias terminals SET1 to SETN. Therefore, a DC bias of about 0 V is applied to the liquid crystal between these common and segment electrodes and the service life of the liquid crystal is thus prolonged.

If the display control signal DCS goes to a logic level "0" when that n-channel MOS transistor of a segment bias circuit 31-i which corresponds to the MOS transistor TR14 is ON as shown in FIG. 5A, the gate and source voltages of this n-channel MOS transistor are set at the VD level and the n-channel MOS transistor is not completely turned on. Therefore, the output voltage from the segment bias circuit 31-i does not reach the VD level, and is set at the level (VD−ΔVD). In this example, the display control signal DCS is set at a logic level "0" when the first common electrode selection signal CES1 is set at a logic level "1" and the second and third common electrode selection signals CES2 and CES3 and the voltage polarity selection signal VPS are each set at a logic level "0". Thus, the MOS transistor TR10 is set to the close-to-ON state. More specifically, since the gate and source voltages of this MOS transistor TR10 are set at the VD level, the drain voltage of this transistor is set at the level (VD−ΔVD). Then, the common electrode bias terminals CET1 to CET3 are set at levels of (VD−ΔVD), VD and VD, respectively, as shown in FIGS. 5D to 5F. As a result, as shown in FIG. 5I, when the display control signal DCS is at a logic level "0", a voltage of the level ΔVD is applied to a corresponding portion of the liquid crystal. This will shorten the service life of this liquid crystal portion.

Figure 6:
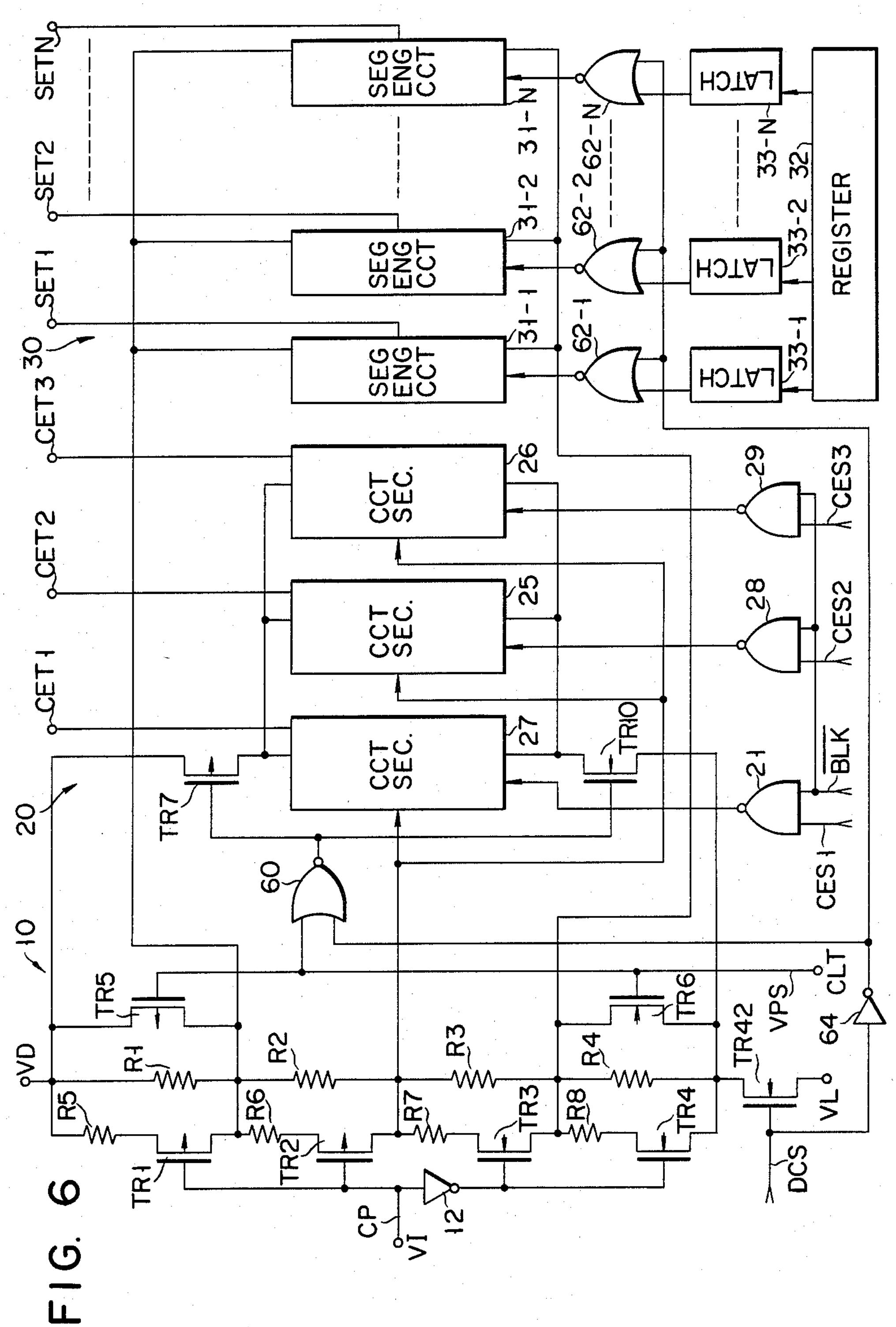
FIG. 6 is a circuit diagram of a liquid crystal driver circuit according to another embodiment of the present invention, which is an improvement over the circuit shown in FIG. 4.

FIG. 6 shows a liquid crystal driver circuit according to another embodiment of the present invention, which is an improvement over the driver circuit shown in FIG. 4. The driver circuit shown in FIG. 6 is basically the same as that shown in FIG. 4 except that a NOR gate 60 is used in place of the inverter 22, and NOR gates 62-1 to 62-N are connected at one input terminal to respective latch circuits 33-1 to 33-N and connected at the output terminal to respective segment bias circuits 31-1 to 31-N. The display control signal DCS is supplied to the other input terminal of each of the NOR gates 60 and 62-1 to 62-N through an inverter 64.

When the display control signal DCS is at a logic level "1", the liquid crystal driver circuit shown in FIG. 6 operates in the same manner as that shown in FIG. 4. When the display control signal DCS is set at a logic level "0", a MOS transistor TR42 is turned off, and an inverter 64 generates an output signal of a logic level "1". Thus, the NOR gates 60 and 62-1 to 62-N generate signals of logic level "0" independently of the voltage polarity selection signal VPS supplied to the control terminal CLT and of the output signals from the latch circuits 33-1 to 33-N. As a consequence, a MOS transistor TR7 and p-channel MOS transistors of the segment bias circuits 31-1 to 31-N which correspond to the MOS transistor TR13 (FIG. 4) are all turned on. The voltage of the VD level is applied to common electrode bias terminals CET1 to CET3 and to segment electrode bias terminals SET1 to SETN. Since a DC bias of 0 V is applied to any part of the liquid crystal between the common and segment electrodes, the service life of the liquid crystal may be prolonged.

Although the present invention has been described with reference to the particular embodiments, the present invention is not limited to these embodiments. For example, it is possible, in the embodiment shown in FIG. 4, to omit the MOS transistor TR40.

The driver circuits shown in FIGS. 4 and 6 are designed to generate a liquid crystal driving voltage having a $\frac{1}{3}$ duty cycle. However, these circuits may be easily modified to generate liquid crystal driving voltages of other duty cycles.

What we claim is:

1. A liquid crystal drive circuit comprising:

first and second power source terminals;

a voltage divider circuit which generates liquid crystal driving voltages to drive a liquid crystal and which includes a series circuit having a plurality of resistive means connected between said first and second power source terminals, and at least one first switching means connected in parallel with at least one of said plurality of resistive means;

second switching means connected at one end to said series circuit and at the other end to one of said first and second power source terminals; and third switching means connected between said one end of said second switching means and the other one of said first and second power source terminals, said second and third switching means being set in opposite conduction states.

2. A circuit according to claim 1, wherein said plurality of resistive means have the same resistance.

3. A circuit according to claim 1 or 2, wherein said first switching means comprises a first switching element which is connected in parallel with a first one of said plurality of resistive means which is connected at one end to said first power source terminal, and a second switching element which is connected in parallel with a second one of said plurality of resistive means which is connected at one end to said second power source terminal through said second switching means.

4. A circuit according to claim 3, wherein said first and second switching elements comprise MOS transistors.

5. A circuit according to claim 4, further comprising a plurality of series circuits each of which is formed of resistive and switching elements and each of which is connected in parallel with a corresponding one of said plurality of resistive means, said resistive element of said series circuit having a resistance smaller than the resistance of each of said plurality of resistive means.

6. A circuit according to claim 5, wherein said switching element of said series circuit is formed of a MOS transistor.

7. A circuit according to claim 1 or 2, further comprising a plurality of series circuits each of which is formed of resistive and switching elements and each of which is connected in parallel with a corresponding one of said plurality of resistive means, said resistive element of said series circuit having a resistance smaller than that of each of said plurality of resistive means.

8. A circuit according to claim 7, wherein said switching element of said series circuit is formed of a MOS transistor.

* * * * *